United States Patent
Ma et al.

(10) Patent No.: US 10,957,769 B2
(45) Date of Patent: Mar. 23, 2021

(54) HIGH-MOBILITY FIELD EFFECT TRANSISTORS WITH WIDE BANDGAP FIN CLADDING

(71) Applicant: Intel Corporation, Santa Clara, CA (US)

(72) Inventors: Sean T. Ma, Portland, OR (US); Chandra S. Mohapatra, Beaverton, OR (US); Gilbert Dewey, Hillsboro, OR (US); Willy Rachmady, Beaverton, OR (US); Harold W. Kennel, Portland, OR (US); Matthew V. Metz, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 268 days.

(21) Appl. No.: 16/303,655

(22) PCT Filed: Jun. 17, 2016

(86) PCT No.: PCT/US2016/038210
§ 371 (c)(1),
(2) Date: Nov. 20, 2018

(87) PCT Pub. No.: WO2017/218015
PCT Pub. Date: Dec. 21, 2017

(65) Prior Publication Data
US 2020/0321439 A1    Oct. 8, 2020

(51) Int. Cl.
*H01L 27/088*    (2006.01)
*H01L 29/205*    (2006.01)
(Continued)

(52) U.S. Cl.
CPC .... *H01L 29/205* (2013.01); *H01L 21/823821* (2013.01); *H01L 27/0924* (2013.01); *H01L 29/1054* (2013.01); *H01L 29/66795* (2013.01)

(58) Field of Classification Search
CPC ............... H01L 29/205; H01L 29/1054; H01L 29/66795; H01L 21/823821; H01L 27/0924
(Continued)

(56) References Cited

U.S. PATENT DOCUMENTS

| 4,566,025 | A | 1/1986 | Jastrzebski et al. |
| 5,296,401 | A | 3/1994 | Mitsui et al. |

(Continued)

OTHER PUBLICATIONS

International Search Report and Written Opinion for International Patent Application PCT/US2016/038210, dated Mar. 16, 2017, 10 pgs.

(Continued)

*Primary Examiner* — Calvin Y Choi
(74) *Attorney, Agent, or Firm* — Green, Howard & Mughal LLP

(57) ABSTRACT

Monolithic FETs including a fin of a first III-V semiconductor material offering high carrier mobility is clad with a second III-V semiconductor material having a wider bandgap. The wider bandgap cladding may advantageously reduce band-to-band tunneling (BTBT) leakage current while transistor is in an off-state while the lower bandgap core material may advantageously provide high current conduction while transistor is in an on-state.
In some embodiments, a InGaAs cladding material richer in Ga is grown over an InGaAs core material richer in In. In some embodiments, the semiconductor cladding is a few nanometers thick layer epitaxially grown on surfaces of the semiconductor core. The cladded fin may be further inte-
(Continued)

grated into a gate-last finFET fabrication process. Other embodiments may be described and/or claimed.

20 Claims, 10 Drawing Sheets

(51) Int. Cl.
    *H01L 21/8238* (2006.01)
    *H01L 27/092* (2006.01)
    *H01L 29/10* (2006.01)
    *H01L 29/66* (2006.01)

(58) Field of Classification Search
    USPC ........................................................ 257/401
    See application file for complete search history.

(56) References Cited

U.S. PATENT DOCUMENTS

| | | | |
|---|---|---|---|
| 6,121,100 A | 9/2000 | Andideh et al. | |
| 8,264,032 B2 | 9/2012 | Yeh | |
| 8,674,341 B2 | 3/2014 | Ko | |
| 9,653,580 B2 | 5/2017 | Balakrishnan et al. | |
| 2002/0185679 A1 | 12/2002 | Baliga | |
| 2004/0211955 A1 | 10/2004 | Hsu et al. | |
| 2005/0093033 A1 | 5/2005 | Kinoshita et al. | |
| 2007/0090416 A1* | 4/2007 | Doyle ................. | H01L 27/1211 257/288 |
| 2009/0108350 A1 | 4/2009 | Cai et al. | |
| 2010/0025771 A1 | 2/2010 | Hoentschel et al. | |
| 2010/0148153 A1 | 6/2010 | Hudait et al. | |
| 2010/0163847 A1 | 7/2010 | Majhi | |
| 2010/0193840 A1 | 8/2010 | Doyle et al. | |
| 2010/0252862 A1 | 10/2010 | Ko | |
| 2011/0133292 A1 | 6/2011 | Lee | |
| 2012/0007183 A1 | 1/2012 | Chang et al. | |
| 2012/0139047 A1 | 6/2012 | Luo et al. | |
| 2012/0248502 A1 | 10/2012 | Cheng et al. | |
| 2013/0056795 A1 | 3/2013 | Wu et al. | |
| 2013/0113051 A1 | 5/2013 | Cai et al. | |
| 2013/0134488 A1 | 5/2013 | Fumitake | |
| 2013/0228875 A1* | 9/2013 | Lee ................... | H01L 21/76224 257/401 |
| 2014/0070276 A1 | 3/2014 | Ko et al. | |
| 2014/0084239 A1* | 3/2014 | Radosavljevic ...... | H01L 29/201 257/12 |
| 2014/0175515 A1 | 6/2014 | Then et al. | |
| 2014/0252478 A1 | 9/2014 | Doornbos et al. | |
| 2014/0374841 A1 | 12/2014 | Wang et al. | |
| 2015/0021662 A1 | 1/2015 | Basu et al. | |
| 2015/0025546 A1 | 1/2015 | Taylor et al. | |
| 2015/0093868 A1 | 4/2015 | Obradovic et al. | |
| 2015/0228795 A1 | 8/2015 | Yang et al. | |
| 2015/0236114 A1 | 8/2015 | Ching et al. | |
| 2015/0243756 A1* | 8/2015 | Obradovic .......... | H01L 29/7848 438/285 |
| 2015/0255456 A1 | 9/2015 | Jacob et al. | |
| 2015/0255460 A1 | 9/2015 | Cheng et al. | |
| 2015/0255545 A1 | 9/2015 | Holland et al. | |
| 2015/0255548 A1 | 9/2015 | Holland | |
| 2015/0263138 A1 | 9/2015 | Kim | |
| 2015/0263159 A1 | 9/2015 | Ching et al. | |
| 2016/0005834 A1* | 1/2016 | Pawlak ............. | H01L 21/02532 257/347 |
| 2016/0043188 A1 | 2/2016 | Chu et al. | |
| 2016/0093697 A1* | 3/2016 | Bergendahl .......... | H01L 29/122 257/14 |
| 2016/0204263 A1 | 7/2016 | Mukherjee et al. | |
| 2017/0047404 A1 | 2/2017 | Bentley et al. | |
| 2018/0145077 A1 | 5/2018 | Dewey et al. | |
| 2018/0254332 A1 | 9/2018 | Mohapatra et al. | |

OTHER PUBLICATIONS

International Preliminary Report on Patentability from PCT/US2016/038210 dated Dec. 27, 2018, 7 pgs.
Ayers, J.E., "Epitaxy", <http://engr.uconn.edu/~jayers/epitaxy.htm>, online Jun. 15, 2015, 16 pgs.
Huang, C-Y, "III-V Ultra-Thin-Body InGaAs/InAs MOSFETs for Low Standby Power Logic Applications", University of California Santa Barbara, Doctoral Thesis, Sep. 2015, pp. 1-167.
Nahory, R.E., "Band gap versus composition and demonstration of Vegard's law for In1-xGaxAsyP1-y lattice matched to LnP", App. Phys. Lett. 33(7), pp. 659-661, Oct. 1978.
Nahory, R.E., "Enegry-Gap Values for InxGA1-xAs at 300k", The Semiconductors-Information Web-Site, <hhttps://www.semiconductors.co.uk/eg(ingaas).html>, 4 pgs.
Porod, W., "Modification of the virtual-crystal approximation for ternary III-V compounds", Phys. Rev., B27, No. 4, pp. 2587-2589, Feb. 15, 1983.

* cited by examiner

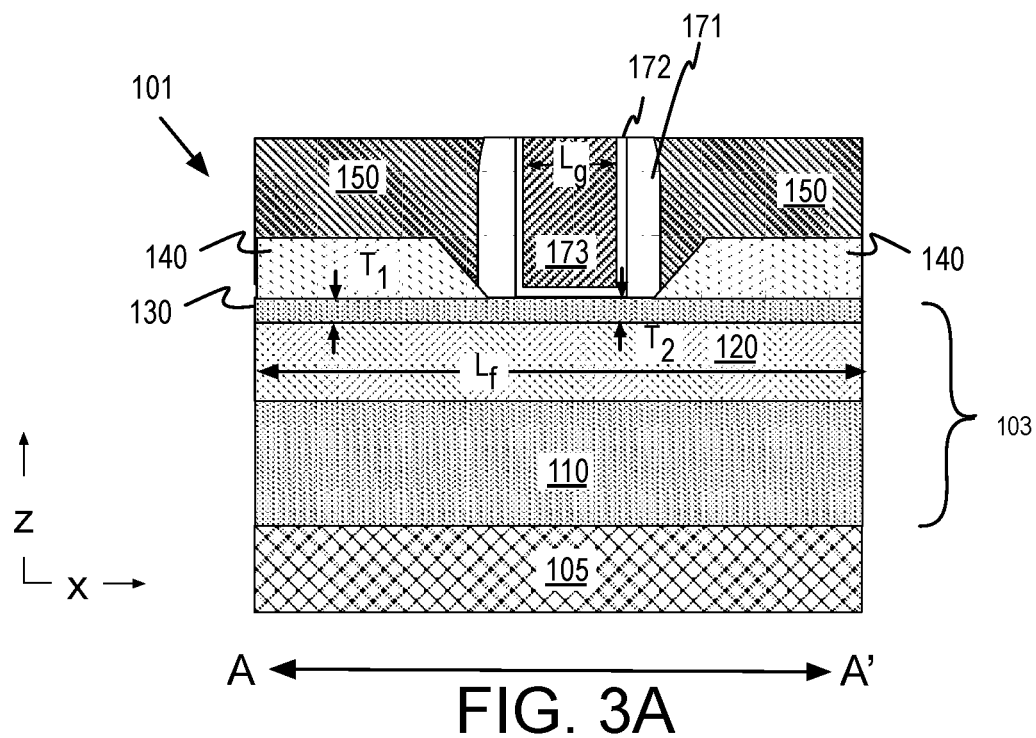
FIG. 3A
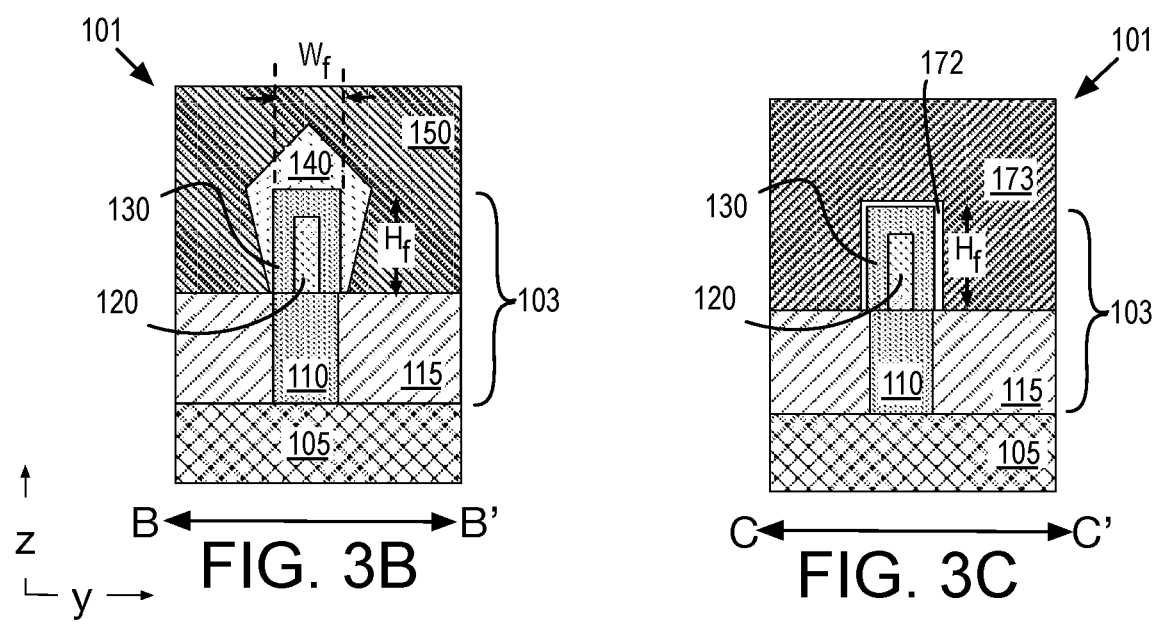
FIG. 3B
FIG. 3C

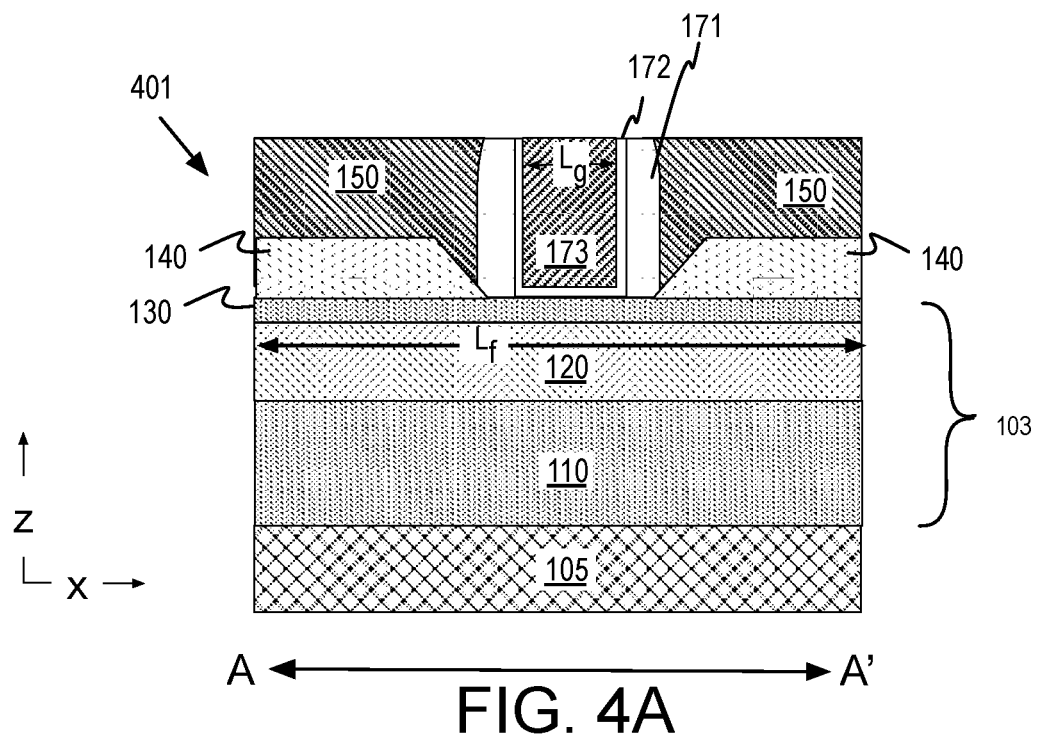
FIG. 4A
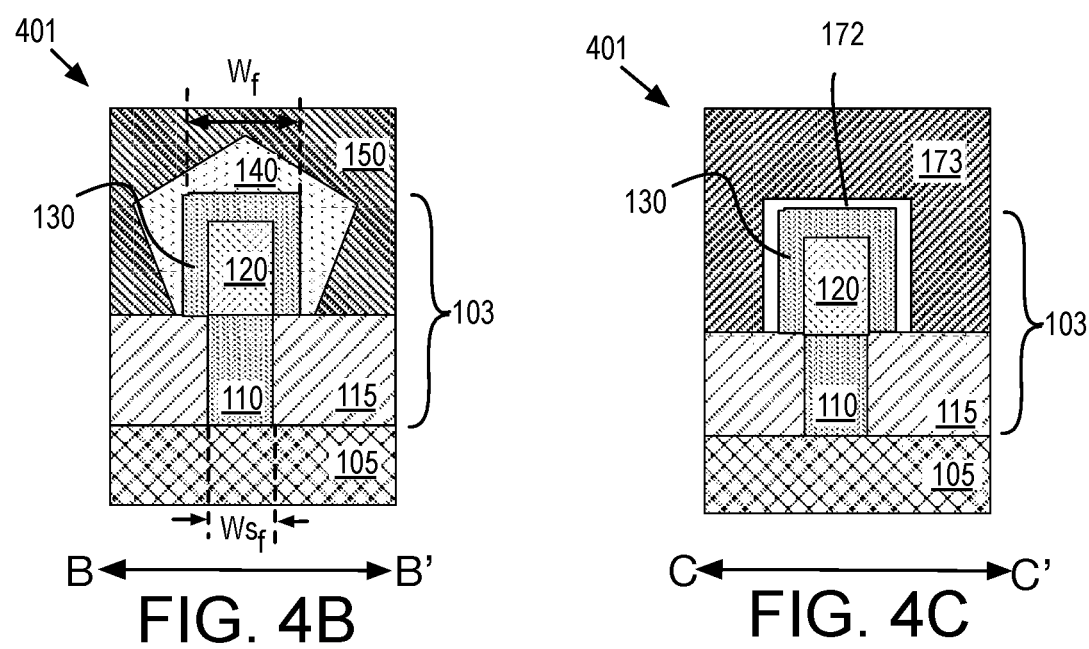
FIG. 4B
FIG. 4C

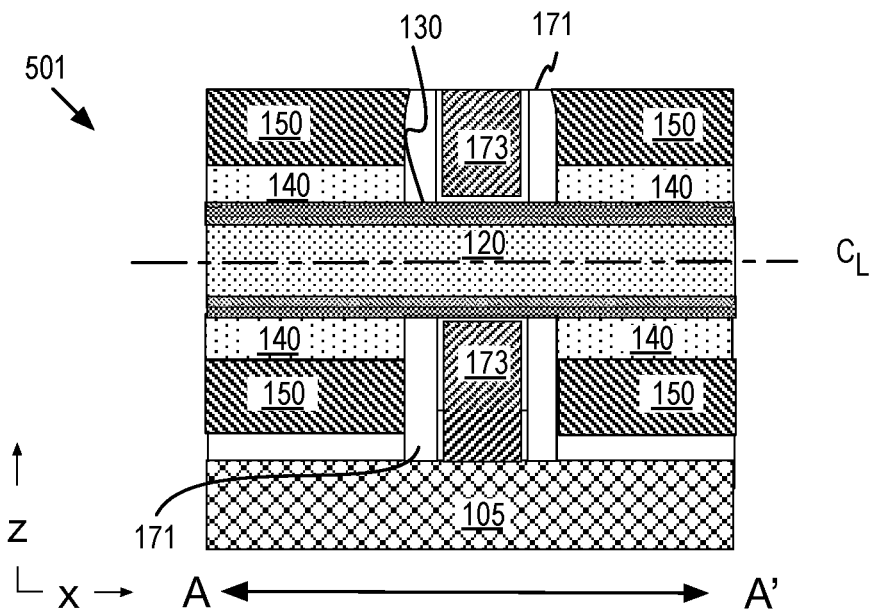
FIG. 5A
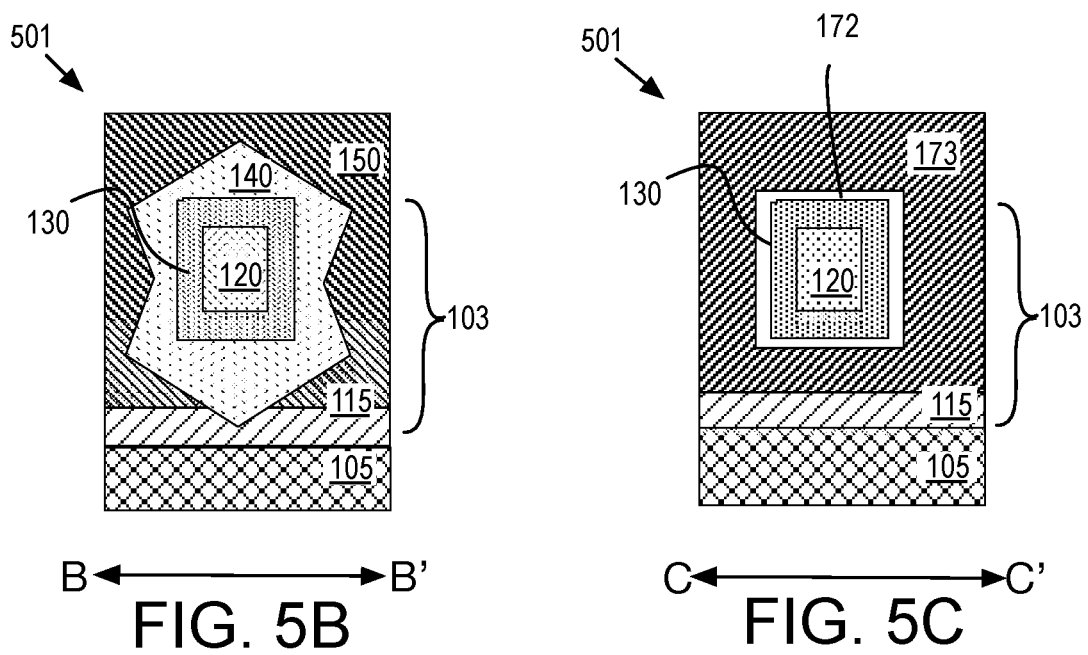
FIG. 5B
FIG. 5C

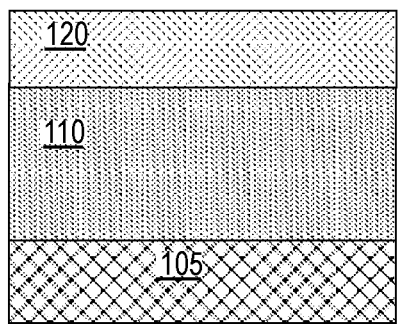
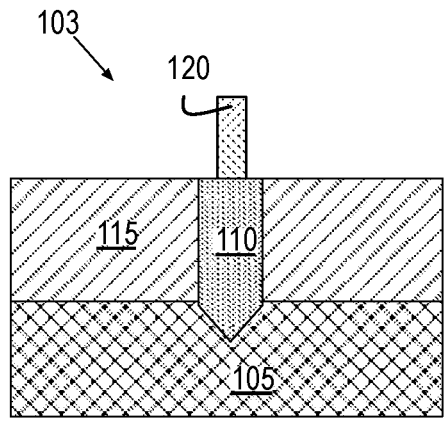
FIG. 10A  FIG. 10B
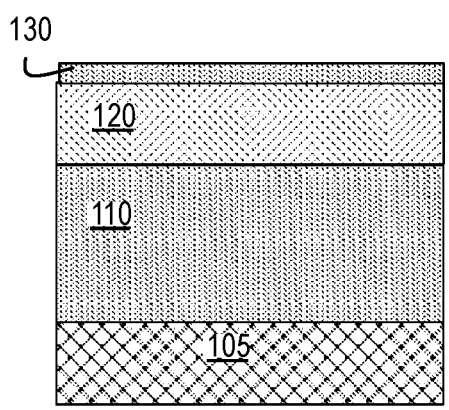
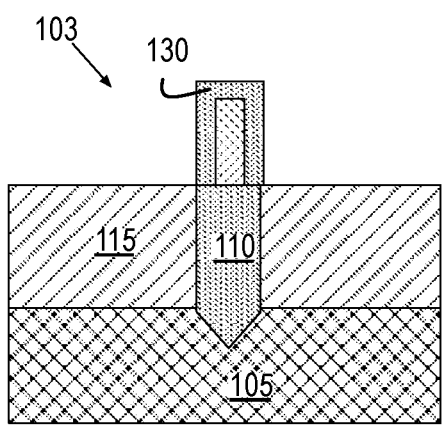
FIG. 11A  FIG. 11B
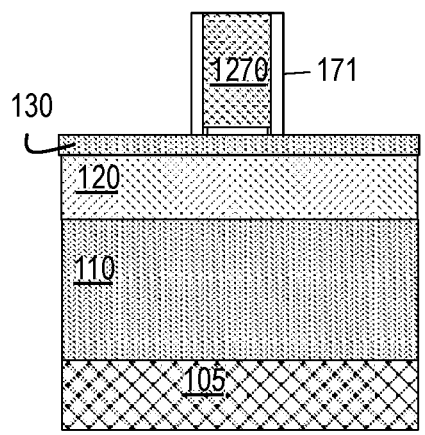
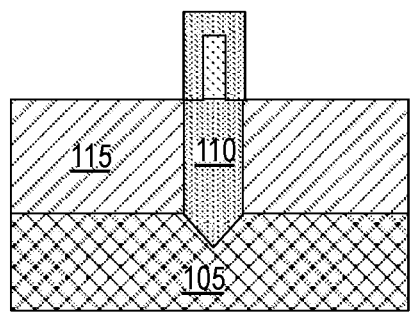
FIG. 12A  FIG. 12B

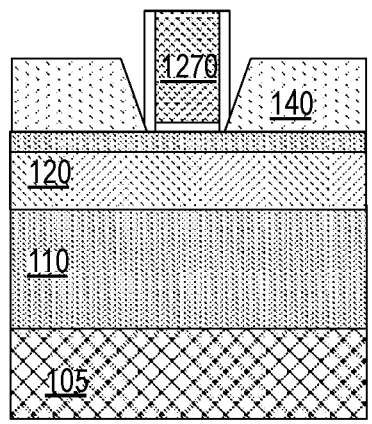 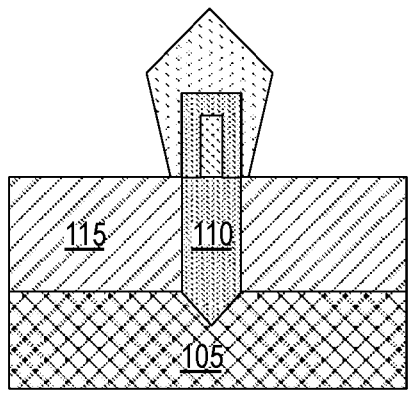
FIG. 13A   FIG. 13B
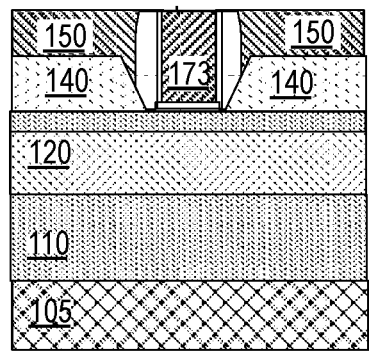 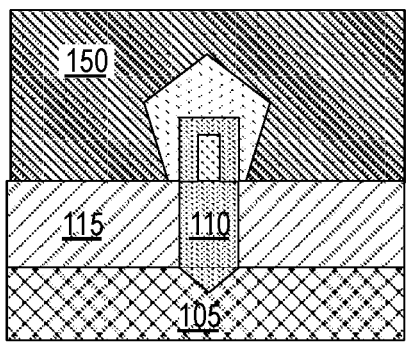
FIG. 14A   FIG. 14B

HIGH-MOBILITY FIELD EFFECT TRANSISTORS WITH WIDE BANDGAP FIN CLADDING

CLAIM OF PRIORITY

This Application is a National Stage Entry of, and claims priority to, PCT Application No. PCT/US2016/038210, filed on Jun. 17, 2016 and titled "HIGH-MOBILITY FIELD EFFECT TRANSISTORS WITH WIDE BANDGAP FIN CLADDING", which is incorporated by reference in its entirety for all purposes.

BACKGROUND

Efforts to extend Moore's law for integrated circuitry (IC) have included the development of transistors employing materials other than silicon, such as III-V compound semiconductor materials (e.g., InP, InGaAs, InAs). These high-mobility material systems typically display higher carrier mobility than silicon devices, and so their introduction has long been suggested as path toward faster transistors. However, along with higher carrier mobility, in a field effect transistor (FET) the off-state ($I_{off}$) leakage can be significantly higher than for a silicon-based FET of equal effective (electrical) channel length. At high off-state drain to gate biases, band-to-band tunneling (BTBT) within the high-mobility device may be significant and cause substantial Gate Induced Drain Leakage (GIDL) current. In a silicon-based FET, subthreshold leakage is typically much larger than GIDL current. However, with smaller III-V bandgap semiconductors in the gated channel, GIDL current can contribute significantly to $I_{off}$.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 3A illustrates a cross-sectional view through a length of channel region and source/drain regions of the high-mobility finFET depicted in FIG. 1, in accordance with some embodiments;

FIG. 3B illustrates a cross-sectional view through a fin width within a source/drain region of the high-mobility finFET depicted in FIG. 2, in accordance with some embodiments;

FIG. 3C illustrates a cross-sectional view through a fin width within a channel region of the high-mobility finFET depicted in FIG. 2, in accordance with some embodiments;

FIG. 4A, 4B, 4C illustrates cross-sectional views through lengths and widths of the high-mobility finFET depicted in FIG. 1, in accordance with some alternate embodiments;

FIG. 5A, 5B, 5C illustrates cross-sectional views through lengths and widths of a nano-wire high-mobility FET, in accordance with some alternate embodiments;

FIGS. 7A, 8A, 9A, 10A, 11A, 12A, 13A and 14A illustrate cross-sectional views through a length of the channel region and source/drain regions of a high-mobility finFET evolving as the method illustrated in FIG. 6 is performed, in accordance with some embodiments;

FIGS. 7B, 8B, 9B, 10B, 11B, 12B, 13B and 14B illustrate cross-sectional views through a width of a fin structure within a region of a high-mobility finFET evolving as the method illustrated in FIG. 6 is performed, in accordance with some embodiments;

DETAILED DESCRIPTION

Figure 1:
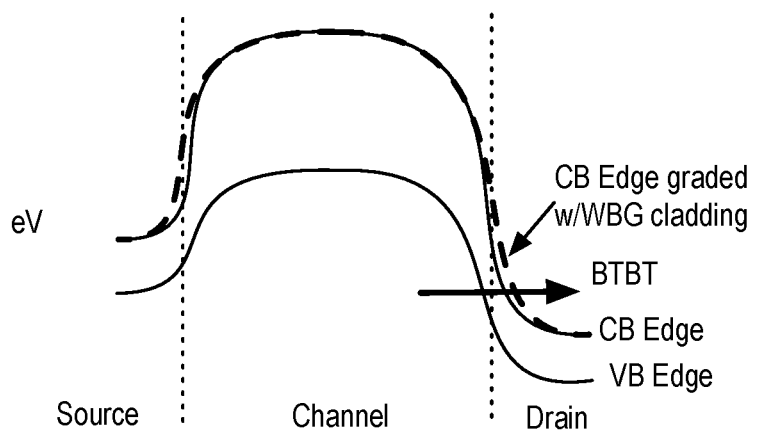
FIG. 1 is a band diagram illustrating the effect of introducing a wide bandgap cladding on BTBT of a high-mobility finFET, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In embodiments described further below, a first III-V semiconductor material is employed for a core of a fin in which a transistor channel region resides. For such a core material, carrier mobility may be higher and bandgap lower than that of silicon. Off-state leakage may also be more significant than for a reference silicon FET of a similar channel length. Techniques and transistor architectures to reduce off-state leakage for a given channel length are an important aspect of employing high-mobility semiconductor material systems to extend Moore's law. Rather than simply achieving higher individual transistor performance (e.g., higher $F_t$), achieving reductions in off-state leakage may enable further lateral scaling, and greater transistor density. In some embodiments described herein, a wide band gap material is included as a fin cladding to reduce transistor BTBT leakage current for a given channel length relative to a FET employing only the core material. In some such embodiments, the fin core material is a first binary or ternary III-V alloy and the fin cladding is a ternary or quaternary III-V alloy that is richer in a constituent that introduces a conduction band offset (CBO) and/or a valance band offset (VBO) that increases the energy barrier to charge carrier tunneling.

In some embodiments described further below, monolithic FETs include a fin having a core of a first III-V semiconductor material disposed over a substrate. The fin further includes a cladding of a second III-V semiconductor material disposed on a surface (e.g., a sidewall) of the core semiconductor. A gate electrode is disposed over the cladding within a channel region. In some advantageous embodiments, neither the core nor the cladding semiconductor is intentionally doped with any electrically active impurity. With both the core and cladding semiconductor intrinsic, carrier mobility may be advantageously high. A pair of heavily-doped semiconductor source/drain regions interface with the channel region through the cladding. The semiconductor cladding is associated with a CBO from the core semiconductor that reduces BTBT tunneling during transistor high bias conditions in the off-state. Hence, for an n-type transistor, the cladding alloy composition has at least a CBO from the core alloy composition attributable to the cladding material having a smaller electron affinity (i.e., higher conduction band energy) than the core semiconductor material. For exemplary embodiments where the cladding separates the channel region from both the source and drain semiconductor, the thickness and/or composition of the cladding may be optimized to provide sufficient off-state leakage reduction while also maintaining sufficiently low access resistance. For example, a differential in cladding layer thickness between the channel region and the source/drain regions may be formed by thinning the cladding layer within the channel region prior to metal gate deposition or thinning the cladding layer within the source/drain regions prior to source/drain semiconductor deposition.

FIG. 1 is a band diagram illustrating the reduced BTBT in a high-mobility finFET including a wider bandgap semiconductor cladding, in accordance with some embodiments described herein. In FIG. 1, the solid lines represent the energy (e.g., eV) at conduction and valence band edges for a high-mobility finFET including a fin of homogeneous III-V alloy composition. In some NMOS examples, the solid lines are a reference $In_xGa_{1-x}As$ alloy composition. Generally, as In content increases, charge carrier (i.e., electron) velocity increases due to lower effective transport mass. The higher carrier velocity translates into higher on-state transistor current. However, the greater the In composition, the narrower the bandgap of the semiconductor. For a FET in the off-state, there are high electric fields between the gate and drain (e.g., where $V_g=0$, $V_d$=high) causing the energy band edges near the drain side to bend so much that carriers can tunnel from the valance band to the conduction band through the forbidden bandgap, resulting in elevated BTBT leakage that hinders the transistor's ability to turn off.

The charge centroid for current conduction within a finFET of nanometer dimensions occurs at the center of the fin (e.g., due to quantum confinement). For a heterogeneous semiconductor fin that includes a fin cladding in accordance with some embodiments, a majority of charge carriers at the source-side will pass through the cladding semiconductor and into the core semiconductor, a quantum well, within the channel region where they then pass through the cladding semiconductor again to reach the drain-side. The dashed line in FIG. 1 represents the energy (e.g., eV) at the conduction band edge with addition of a semiconductor cladding having a CBO from a core semiconductor. In some exemplary NMOS embodiments where the heterogeneous semiconductor fin includes a core of the reference $In_xGa_{1-x}As$ alloy clad by a second $In_xGa_{1-x}As$ alloy that is richer in Ga, the resultant CBO at the drain side of the channel region increases the bandgap, which reduces BTBT current for a given electric field relative to a homogeneous fin of the reference $In_xGa_{1-x}As$ alloy. In some embodiments, the cladding provides at least a 0.1 eV offset in the relevant band (conduction or valence) from the core semiconductor.

In some further embodiments, an impurity-doped III-V source/drain semiconductor is grown on a surface of the cladding. The impurity doping, which may be $10^{16}$ cm$^{-3}$, or more, advantageously reduces the impact the wide band gap material has on access resistance (e.g., $R_{ext}$). The source/drain semiconductor may be of a graded III-V composition proceeding from the cladding alloy composition proximal to the cladding to a third alloy composition beyond a distance from the cladding interface. The third alloy composition may be associated with a narrow bandgap, for example that is smaller than that associated with the core alloy composition. This third alloy composition of the source/drain may enable a low resistance to a contact metallization. With the source/drain semiconductor graded to the cladding composition, cladded finFETs in accordance with embodiments herein may display little shift in on-state resistance from a finFET employing a homogeneous fin of similar dimension and composition as the core semiconductor. Although not bound by theory, the minimal impact on on-state resistance may be because of higher charge carrier energy in the transistor on-state attributable to source-side injection of carriers surmounting the CBO within the cladding.

Figure 2:
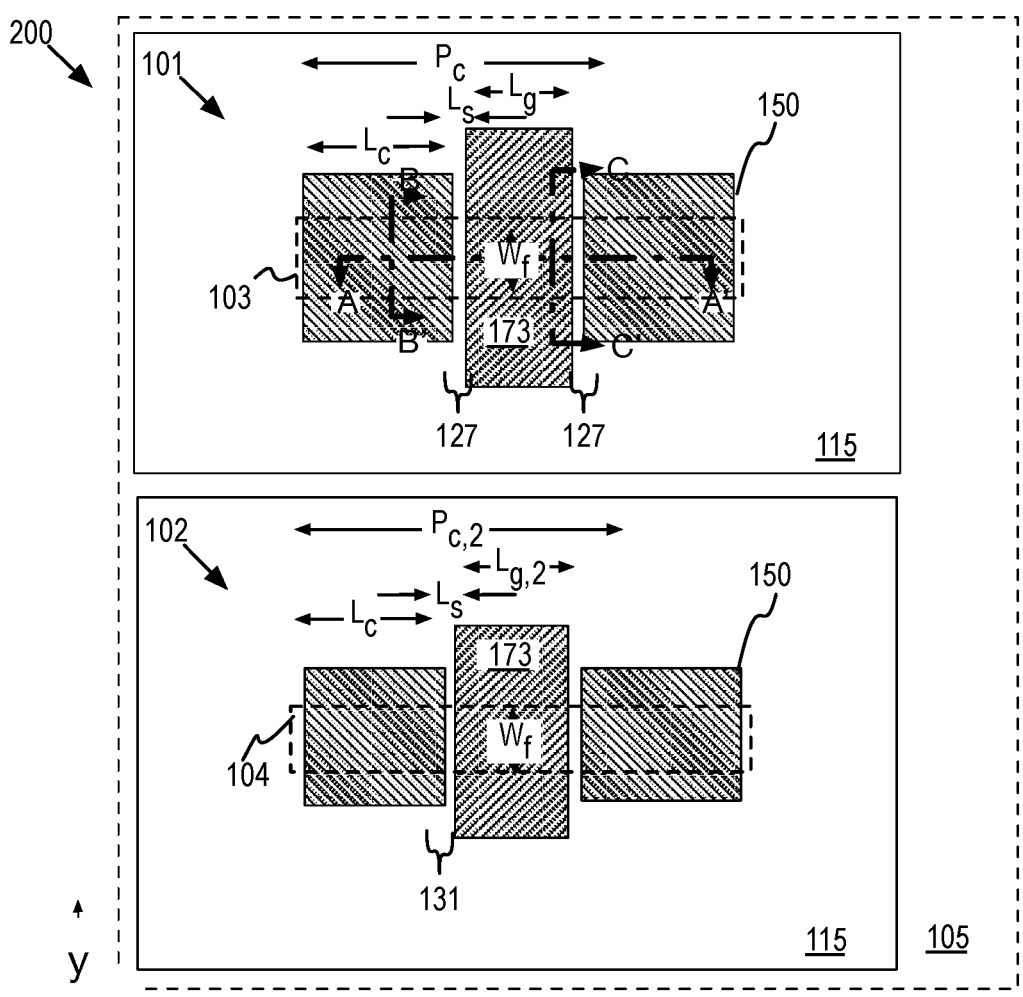
FIG. 2 is a plan view of an IC including a high-mobility finFET disposed over a substrate, in accordance with some embodiments.

FIG. 2 is a plan view of complementary metal-oxide-semiconductor (CMOS) circuitry 200 including a finFET 101 and a finFET 102 disposed over a substrate layer 105 and surrounded by a field isolation dielectric 115, in accordance with some embodiments. In the exemplary embodiment, finFET 101 is an NMOS device while finFET 102 is a PMOS device. At least finFET 101 has one or more of the structural attributes described further below. For such embodiments, finFET 102 may have any architecture including a silicon channel or other group IV semiconductor (e.g., Ge or SiGe) channel having higher hole mobility than silicon. In some embodiments, a high-mobility NMOS fin-FET 101 is coupled with a high-mobility PMOS finFET 102, both of which have one or more of the structural attributes described further below.

In some embodiments, substrate layer 105 is silicon (Si), which is advantageous for monolithic integration of finFETs 101 and 102. Crystallographic orientation of a substantially monocrystalline substrate layer 105 in exemplary embodiments is (100), (111), or (110). However, other crystallographic orientations are also possible. For example, the substrate working surface may be miscut, or offcut 2-10° toward [110] to facilitate nucleation of crystalline heteroepitaxial material. Other substrate layers are also possible. For example, substrate layer 105 may be any of silicon-carbide (SiC), sapphire, III-V compound semiconductor (e.g., GaAs), silicon on insulator (SOI), germanium (Ge), or silicon-germanium (SiGe). Substrate layer 105 may also comprise any thin film dielectric, and/or metal and/or semiconductor film deposited on a back-side of finFETs 101, 102 during back-side processing that preceded (or was subsequent to) transistor fabrication. Substrate layer 105 may also be any bulk dielectric, and/or metal, and or semiconductor to which a semiconductor layer was transferred before finFETs 101, 102 were fabricated in the transferred semiconductor layer, or to which the finFETs 101, 102 were transferred after their fabrication on a donor substrate. Field isolation material 115 may be any dielectric material suitable for providing electrical isolation between transistors. In some exemplary embodiments, field isolation material 180 is silicon dioxide. Other materials known to be suitable for the purpose may also be utilized, including low-k materials (e.g., having a relative dielectric constant below 3.9). Although embodiments are not limited in this respect, other exemplary materials include carbon-doped oxides (SiOC, SiOCH) and siloxane derivatives.

In the illustrated embodiment, finFET 101 is associated with a transistor cell area equal to the transistor cell area associated with finFET 102. Specifically, gate length $L_g$ associated with finFET 101 is equal to that of finFET 102. Source/drain contact length $L_c$ and lateral spacing $L_s$ between source/drain contact metallization 150 and an edge of gate electrode 173 are both equivalent for the two finFETs 101, 102. As noted above, off-state leakage current for a high-mobility channel material may be considerably higher than for a silicon-channeled device of comparable effective channel length and gate/drain overlap dependent on the lateral spacing $L_s$. Thus, in some embodiments, a wide bandgap semiconductor cladding is incorporated into finFET 101 to reduce off-state leakage associated with BTBT that may otherwise result in finFET 101 having worse off-state performance than silicon-channeled finFET 102. Depending on the extent of the band offset within the cladding, finFET 101 may display off-state leakage comparable to, or better than, that of finFET 102. In some embodiments where a high-mobility NMOS finFET 101 is coupled with a conventional silicon PMOS finFET 102, PMOS finFET 102 does not include a comparable wider bandgap semiconductor cladding.

While the fin core III-V semiconductor material may be disposed on any material layer, in some exemplary embodiments, transistor 101 incudes a semiconductor heterojunction fin ("hetero-fin") structure for which the core semiconductor material is further disposed on a "sub-fin" of another semiconductor material with the cladding disposed only on the core semiconductor, as further described below.

FIG. 3A illustrates a cross-sectional view through a longitudinal length of high-mobility finFET 101 along the A-A' plane denoted in FIG. 2, in accordance with some embodiments. FIGS. 3B and 3C illustrate cross-sectional views through a transverse fin width within source/drain and channel region of high-mobility finFET 101 along the B-B' and C-C' planes denoted in FIG. 2, in accordance with some embodiments.

As shown in FIG. 3A-3C, hetero-fin 103 includes a fin core 120 disposed on a sub-fin 110. Sub-fin 110 is embedded in field isolation dielectric 115 (FIG. 2B, 2C). In the exemplary embodiment, fin core 120 is of a first semiconductor material while sub-fin 110 is of a second semiconductor material. The two different materials form a core/sub-fin heterojunction. In some exemplary embodiments where sub-fin 110 does not serve as part of the device channel, sub-fin 110 need not be of a material having high electron mobility. In some advantageous embodiments, sub-fin 110 is a second material of suitable composition so that the heterojunction with core 120 is associated with a band energy offset useful for reducing a substrate leakage current path from core 120 through sub-fin 110. In some N-type transistor embodiments where fin core 120 is to provide an electron channel, sub-fin 110 may have a higher conduction band energy (i.e., positive CBO) than fin core 120.

In some embodiments, sub-fin 110 and fin core 120 are each monocrystalline compound semiconductors with a first sub-lattice of at least one element from group III of the periodic table (e.g., Al, Ga, In), and a second sub-lattice of at least one element of group V of the periodic table (e.g., P, As, Sb). Sub-fin 110 may be a binary, ternary, or quaternary III-V compound semiconductor that is an alloy of two, three, or even four elements from groups III and V of the periodic table. For exemplary N-type transistor embodiments, fin core 120 is advantageously a III-V material having a high electron mobility, such as, but not limited to InGaAs, InP, InSb, and InAs. For some exemplary embodiments, fin core 120 is a ternary III-V alloy, such as InGaAs or GaAsSb. For some $In_xGa_{1-x}As$ fin core embodiments, In content (x) is between 0.6 and 0.9, and advantageously is at least 0.7 (e.g., $In_{0.6}Ga_{0.4}As$). In some embodiments with highest mobility, fin core 120 is intrinsic III-V material and not intentionally doped with any electrically active impurity. In alternate embodiments, one or more impurity at a nominal dopant level may be present within fin core 120, for example to set a threshold voltage $V_t$, or to provide HALO pocket implants, etc. Even for impurity-doped embodiments however, impurity dopant level within fin core 120 is relatively low, for example below $10^{15}$ cm$^{-3}$, and advantageously below $10^{13}$ cm$^{-3}$. The transverse width of fin core 120 may vary anywhere from 2 to 5 nm, for example. Vertical height (e.g., z-dimension in FIG. 3A-3C) of fin core 120 may vary to achieve a desired fin height $H_f$ and a given current-carrying cross-sectional area. Fin core 120 may have a height that is significantly larger than its transverse width (e.g., 10-50 nm, or more).

Sub-fin 110 is advantageously a III-V material having a significant band offset (e.g., conduction band offset for N-type devices) from the fin core. Exemplary materials, include, but are not limited to, GaAs, GaSb, GaAsSb, GaP, InAlAs, GaAsSb, AlAs, AlP, AlSb, and AlGaAs. In some N-type transistor embodiments, sub-fin 110 is GaAs and may also be doped with p-type impurities (e.g., Mg, Be, etc.). The transverse width of sub-fin 110 may be less than, equal to, or greater than the transverse width of fin core 120. In the embodiment illustrated in FIG. 3A-3C, sub-fin 110 has a transverse width $W_f$ that is substantially equal to a sum of the fin core transverse width and twice the thickness of a fin cladding 130. The vertical height of sub-fin 110 may be significantly larger than the transverse width (e.g., 10-50 nm, or more).

As also shown in FIG. 3A-3C, hetero-fin 103 further includes fin cladding 130. Fin cladding 130 is of a different semiconductor material than fin core 120. In advantageous embodiments, fin cladding 130 is monocrystalline, having the same crystal orientation as fin core 120. The two different materials form a core/cladding heterojunction. In the exemplary embodiment, fin cladding 130 extends the entire longitudinal fin length $L_f$ between source/drain semiconductor 140 (FIG. 3A) and is disposed on a longitudinal sidewall of fin core 120 (FIG. 3B-C). Depending on when hetero-fin 103 is cut into separate transistors, cladding 130 may or may not be present on transverse sidewall surfaces of the fin. In some exemplary embodiments where a semiconductor body is cut transversely into two or more fins after formation of source/drain semiconductor 140, cladding 130 is absent from the transverse fin ends. In some exemplary embodiments where the fin is cut transversely before formation of source/drain semiconductor 140, cladding 130 and source/drain semiconductor 140 is disposed on the transverse fin ends.

Cladding 130 is a continuous film separating fin core 120 from a gate stack including gate dielectric 172 and gate electrode 173. As such, cladding 130 may serve as a minor portion of the transistor channel so that electron mobility is less important for cladding 130, and may be sacrificed in favor of a larger bandgap than fin core 120. In some advantageous embodiments, fin cladding 130 is a material of suitable composition so that the heterojunction with core 120 is associated with a band energy offset useful for reducing a BTBT between fin core 120 and drain semiconductor 140. In some N-type transistor embodiments where fin core 120 is to provide the major portion of the electron channel, cladding 130 may have a higher conduction band energy (i.e., positive CBO).

In some embodiments, cladding 130 is a monocrystalline compound semiconductor with a first sub-lattice of at least one element from group III of the periodic table (e.g., Al, Ga, In), and a second sub-lattice of at least one element of group V of the periodic table (e.g., P, As, Sb). Cladding 130 may be a binary, ternary, or quaternary III-V compound semiconductor that is an alloy of two, three, or even four elements from groups III and V of the periodic table. For exemplary N-type transistor embodiments, cladding 130 is advantageously a III-V material having relative large bandgap, such as, but not limited to InGaAs, InP, GaAs, AlGaAs. For some exemplary embodiments, where fin core 120 is a ternary III-V alloy, such as InGaAs, fin cladding 130 is also a ternary III-V alloy, such as InGaAs, but with a different alloy composition. In some embodiments, where cladding 130 and fin core 120 both comprise Ga and/or As alloys, fin core 120 has a higher concentration of In than does fin cladding 130. In some embodiments where fin core 120 is $In_xGa_{1-x}As$, cladding 130 is $In_xGa_{1-x}As$ that is more Ga-rich than core 120. In some such embodiments, In content x is between 0.6 and 0.9 within core 120, while x within cladding 130 is advantageously no more than 0.55, and advantageously between 0.30 and 0.55. In some embodiments, cladding 130 is intrinsic III-V material and not intentionally doped with any electrically active impurity. In alternate embodiments, one or more impurity at a nominal dopant level may be present within fin cladding 130. Even for impurity-doped embodiments however, impurity dopant level within fin cladding 130 is relatively low, for example below $10^{15}$ cm$^{-3}$, and advantageously below $10^{13}$ cm$^{-3}$.

The thickness of semiconductor cladding 130 may vary anywhere from 1 to 5 nm, for example. In some exemplary embodiments where fin core 120 has a transverse width of 2-5 nm, cladding 130 has a thickness of 1.5-3 nm such that the transverse fin width $W_f$, which is the sum of the fin core transverse width and two cladding thicknesses, is 5-11 nm. In some embodiments, thickness of cladding 130 within the channel region differs from that within the source/drain region. In the example shown in FIG. 3A, cladding thickness $T_1$ within the source/drain region is the same as cladding thickness $T_2$ within the channel region. In some embodiments, cladding thickness $T_2$ is less than cladding thickness $T_1$. Cladding thickness $T_1$ may however also be less than cladding thickness $T_2$.

As illustrated in FIGS. 3A and 3C, cladding 130 within the channel region is disposed below (or covered by) gate electrode 173 and gate dielectric 172. While any materials known to be suitable for a gate stack may be utilized, in one exemplary embodiment a high-k material having a bulk relative permittivity of 9, or more, is employed as gate dielectric 172 along with a gate metal that has a work function suitable for the composition of fin core 120. Exemplary high-k dielectric materials include metal oxides, such as, but not limited to $HfO_2$, $Al_2O_3$, and metal silicates, such as, but not limited to $HfSiO_x$ and $AlSiO_x$. In the embodiments illustrated by FIG. 3C, gate dielectric 172 is disposed directly on sidewalls of cladding 130 that define the transverse fin width $W_f$. As further shown in FIG. 3A, on either side of the gate stack are gate sidewall spacers 171, which may be of any dielectric material. Gate sidewall spacers 171 may be in contact with a sidewall of gate electrode 173, or as shown, in contact with (high-k) gate dielectric 172 that covers sidewalls of gate electrode 173. The lateral dimensions of gate sidewall spacers 171 may vary anywhere from 1 to 10 nm, for example. In some exemplary embodiments, gate sidewall spacers 171 provide 2-5 nm of lateral spacing between gate electrode 173 and semiconductor source/drain region 140.

Source/drain semiconductor 140 is heavily-doped, for example having an (n-type) impurity concentration of at least $10^{16}$ cm$^{-3}$. In some embodiments, impurity-doped source/drain region 140 is a compound semiconductor. In some exemplary embodiments, the compound comprises a first sub-lattice of at least one element from group III of the periodic table (e.g., Al, Ga, In), and a second sub-lattice of at least one element of group V of the periodic table (e.g., P, As, Sb). Source/drain semiconductor 140 may be a binary, ternary, or quaternary III-V compound semiconductor that is an alloy of two, three, or even four elements from groups III and V of the periodic table. In advantageous embodiments, source/drain semiconductor 140 is monocrystalline, having the same crystal orientation as fin cladding 130 and fin core 120. In some embodiments, where cladding 130 and fin core 120 both comprise Ga and/or As alloys, source/drain semiconductor 140 is also a Ga and/or As alloy. In some such embodiments, source/drain semiconductor 140 has a higher concentration of In or Sb than does fin cladding 130.

Source/drain semiconductor 140 may further be graded from the III-V also composition of fin cladding 130 proximal to the cladding to a narrower band gap material proximal to a contact metallization. In some embodiments, compositional grading of the source/drain semiconductor begins at the dopant junction between cladding 130 and the impurity-doped source/drain semiconductor 140. The initial source/drain alloy composition may vary, but in some exemplary embodiments, the source/drain composition proximate to the dopant junction is approximately the same as that of fin cladding 130 to avoid an abrupt heterojunction at the dopant junction. In other words, the source/drain semiconductor composition is graded over a film thickness from the composition of fin cladding 130 to a second alloy composition with a smaller bandgap than at least fin cladding 130, and advantageously to a second alloy composition associated with a bandgap smaller than that of fin core 120.

In some $In_xGa_{1-x}As$ source/drain embodiments, the source/drain alloy composition comprises where x is no more than 0.55. Over the grading thickness In content is continuously increase to a second $In_xGa_{1-x}As$, alloy composition in which In content x is at least 0.7, and advantageously 0.9, or more (e.g., InAs). A smooth linear grading may maintain low access resistance. Grading over the compositional range may be over a grading film thickness of 2-10 nm, or more. At least portion of source/drain semiconductor 140 may be of any material suitable to provide ohmic contact with metallization 150. In some embodiments where a Ga-rich InGaAs cladding is graded up to InAs, a low resistance with contact metallization 150 (e.g., Ti/TiN) may be achieved.

Notably, the architectural elements described above in the context of finFET 101 may be applied to a wide array of other finFET architectures. FIG. 4B-4C, for example, depict a finFET 401 in accordance with some alternate embodiments. FinFET 401 has substantially the same layout/footprint as illustrated for finFET 101 (FIG. 2). However, finFET 401 includes a fin core 120 with a transverse width that is substantially equal to that of sub-fin 110 such that the clad fin has a transverse width $W_f$ that is larger than the transverse sub-fin width by approximately twice the thickness of cladding 130. As for FET 101, cladding 130 is present only on surface of fin core 120 (i.e., cladding 130 is absent from surfaces of sub-fin 110). As another example, FIG. 5A-5C depict a nanowire FET 501 having substantially the same layout/footprint as illustrated for finFET 101 in FIG. 2. Nanowire FET 501 however has a cladding, gate stack, and source/drain semiconductor that wraps completely around the III-V semiconductor core. As shown, fin cladding 130 is substantially symmetrical about a longitudinal axis $C_L$ of fin core 120. In this illustrative embodiment, sub-fin semiconductor has been completely replaced with gate stack materials, source/drain semiconductor 140, and contact metallization 150.

High-mobility finFETs in accordance with the architectures above may be fabricated by a variety of methods applying a variety of techniques and processing chamber configurations. Generally, a fin of the core III-V semiconductor material is formed following any known techniques. In some embodiments, III-V hetero-junction fins are fabricated, for example by epitaxially growing numerous islands of III-V material over a silicon substrate having a plurality of seeding surface regions. In some such embodiments, seeding surface regions are surrounded by high aspect ratio sidewalls to practice aspect ratio trapping (ART) and achieve acceptable crystal quality in the heteroepitaxial fin material. The ART technique is one example of local additive heteroepitaxial fin fabrication, which may advantageously reduce the effects of lattice mismatch across various heterojunctions. In alternative embodiments, a conventional subtractive technique may be employed in which a blanket III-V film stack is grown over, or transferred to, a working surface of a substrate. That blanket III-V film stack is then etched into fin cores. Once a fin core is fabricated, the cladding is epitaxially grown on exposed surfaces of the fin. The gate stack and source/drain regions are then formed over the clad fin following any technique known to be suitable for a homogenous semiconductor fin.

Figure 6:
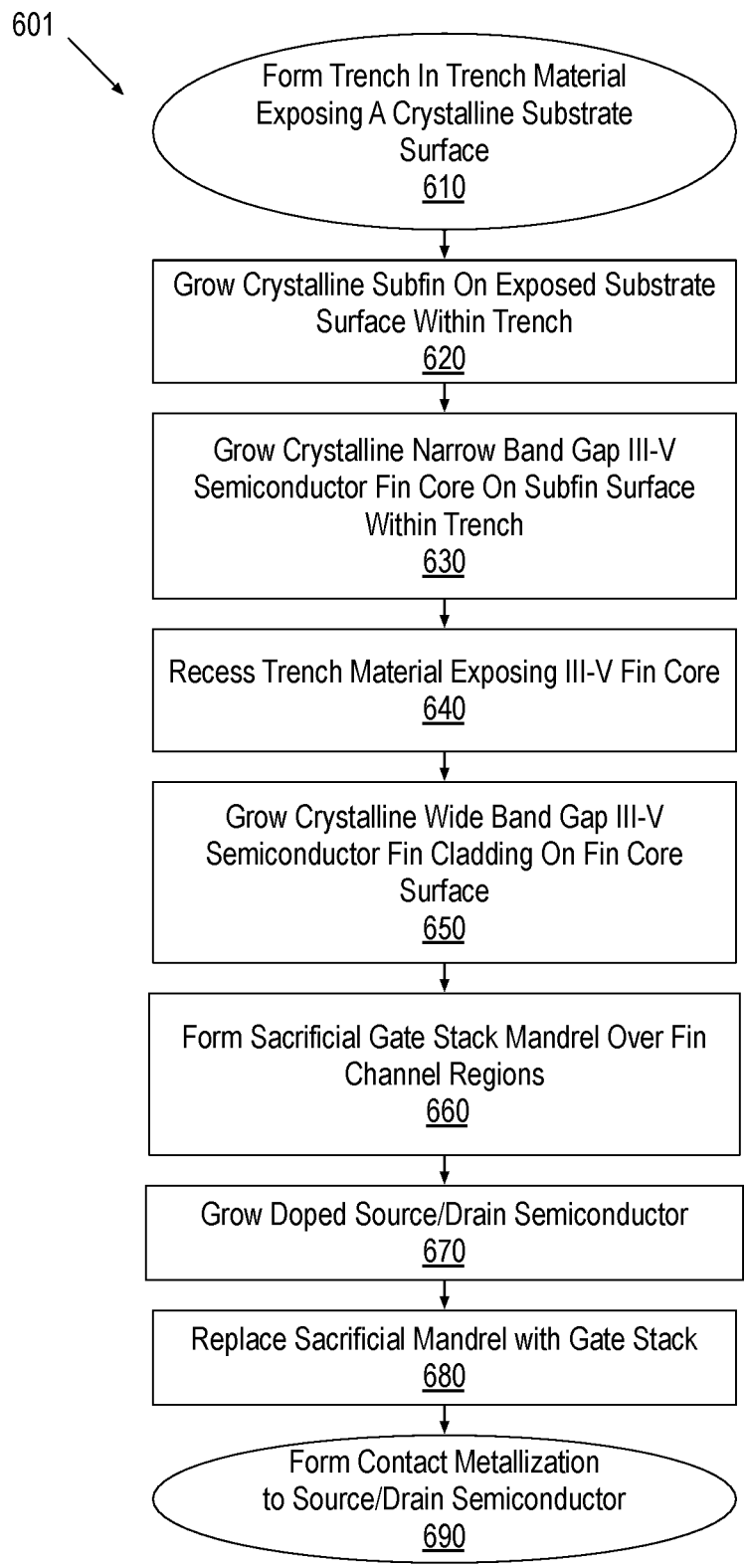
FIG. 6 is a flow diagram illustrating a method of fabricating a high-mobility finFET including a wide bandgap cladding, in accordance with some embodiments.
Figure 7A:
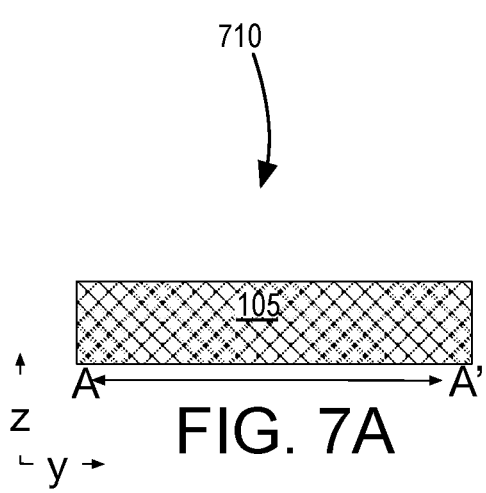
Figure 7B:
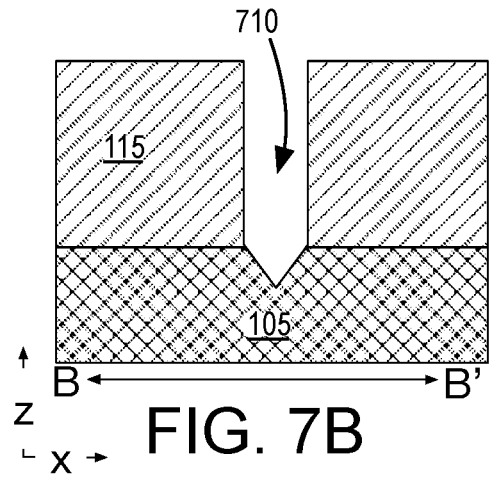
Figure 8A:
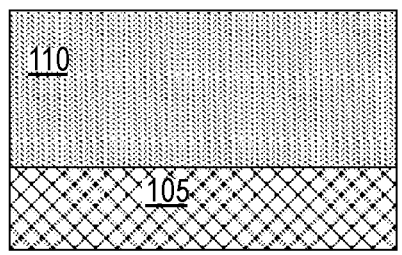
Figure 8B:
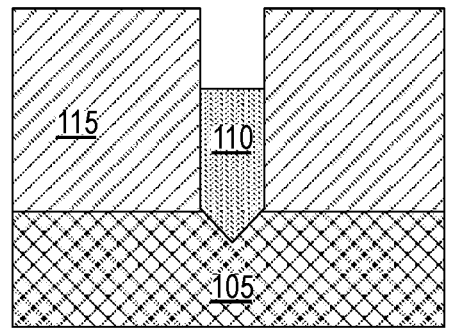
Figure 9A:
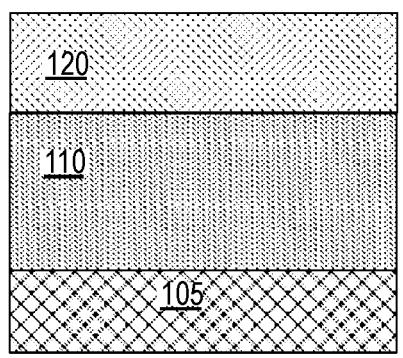
Figure 9B:
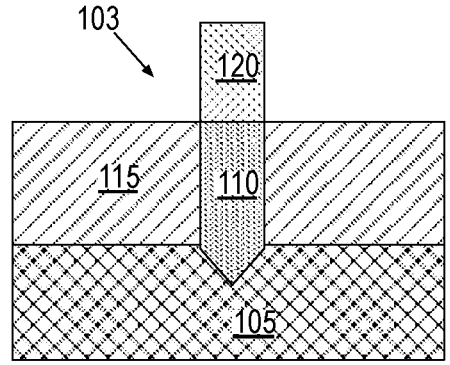

FIG. 6 is a flow diagram illustrating exemplary methods 601 for fabricating a high-mobility finFET with a wide bandgap cladding, in accordance with some embodiments. FIGS. 7A, 8A, 9A, 10A, 11A, 12A, 13A and 14A illustrate cross-sectional views along the A-A' plane of finFET 101 evolving as the methods 601 are performed, in accordance with some embodiments. FIGS. 7B, 8B, 9B, 10B, 11B, 12B, 13B and 14B illustrate cross-sectional views along the B-B' plane of finFET 101 evolving as methods 601 are performed, in accordance with some embodiments.

In reference to FIG. 6, methods 601 begin at operation 610 where a trench is formed in a trench material disposed over a substrate. The trench may be etched completely through a z-thickness of the trench material, exposing a crystalline substrate surface that is to seed a subsequent epitaxial growth. In the exemplary embodiment illustrated in FIG. 7A, 7B, a trench 710 is anistropically etched into a trench layer such as field isolation material 115, exposing a portion of substrate 105 at the bottom of trench 710. In some embodiments, the exposed portion of substrate 105 is recessed etched. In the illustrated example, a recess with positively sloped sidewalls is etched into substrate 105, which may further enhance trapping of crystalline defects (e.g., dislocations) in a subsequently grown crystalline sub-fin material. Although dimensions of trench 710 may vary, the aspect ratio (z-depth:y-dimension) is advantageously at least 2:1 and more advantageously 3:1, or more. In some embodiments, trench 710 has a CD of between 10 and 200 nm. However, trench material z-thickness and CD may be scaled as needed to maintain a workable aspect ratio for a predetermined fin height selected for a desired transistor current carrying width.

Returning to FIG. 6, methods 601 continue at operation 620 where a crystalline sub-fin is epitaxially grown from the substrate surface exposed at the bottom of the trench formed at operation 610. Any epitaxial growth technique, such as, but not limited to, metal-organic chemical vapor deposition (MOCVD), molecular beam epitaxy (MBE), or hydride vapor phase epitaxy (HYPE) may be utilized at operation 620. In the exemplary embodiment illustrated in FIG. 8A, 8B, sub-fin 110 is epitaxially grown selectively to the substrate seeding surface to partially back fill trench 710.

At operation 630 (FIG. 6), feed gases and other epitaxial process control parameters (e.g., temperature, partial pressures, etc.) are changed to epitaxially grow the fin core from the sub-fin surface still contained within the trench. Operations 620 and 630 may be performed in a continuous manner with an in-situ change in growth parameters. In further embodiments where an intervening interfacial material is to be included in the hetero-fin structure, operation 620 may further include multiple growth parameter/feed gas changes following any known technique. In some embodiments, growing the fin core comprises growing a III-V semiconductor material having a second alloy composition with a narrower bandgap than that of the sub-fin. For example, any of the InGaAs compositions described above for the fin core may be grown at operation 630. After epitaxial fin growth, the surrounding trench material may be recessed to a desired level to expose sidewalls of the fin core at operation 640. In the exemplary embodiment illustrated in FIGS. 9A and 9B, field isolation material 115 is recess etched (e.g., with a blanket timed etch). More or less of hetero-fin 103 may be exposed during the recess etch of trench material 115. In the illustrative embodiment, trench material 115 is recessed sufficiently to fully expose fin core 120 without exposing sub-fin 110 in preparation for growth of fin cladding.

Returning to FIG. 6, methods 601 continue at operation 650 where fin cladding is epitaxially grown on exposed surfaces of the fin core. In some embodiments, prior to cladding growth, the fin core is isotropically etched, thereby reducing the fin core dimensions. Any wet or dry etch process known to be suitable for the alloy composition of the core may be utilized. In the exemplary embodiment illustrated in FIG. 10A, 10B, fin core 120 is etched to reduce the transverse fin core width (e.g., to 2-5 nm) below that of sub-fin 110 (e.g., 5-10 nm). Fin core semiconductor need not be etched in the illustrated manner, however. At operation 650, any epitaxial growth technique may be employed to form the fin cladding, such as, but not limited to, MOCVD, MBE, or HYPE. In the exemplary embodiment illustrated in FIG. 11A, 11B, fin cladding 130 is epitaxially grown selectively to the fin core seeding surface to cover at least the sidewall of fin core 120 and increase the transverse width of the fin to be at least as large as that of sub-fin 110. In some embodiments, growing the fin cladding comprises growing a second III-V semiconductor material having a second alloy composition with a wider bandgap than that of the fin core. For example, any of the InGaAs compositions described above for the fin cladding may be grown at operation 650.

Returning to FIG. 6, methods 601 continue at operation 660 where a channel mask is patterned to protect a portion of the III-V fin that is to become the III-V FET channel region. While any known masking technique and material(s) may be employed at operation 660, in some embodiments, the channel mask is a sacrificial gate mandrel retained through a number of processes until being replaced in a "gate-last" finFET fabrication flow. Such embodiments may be advantageously compatible with silicon-channeled fin-FET fabrication, for example enabling PMOS transistors to be concurrently fabricated in other regions of the substrate (e.g. FET 102 in FIG. 2). Any known sacrificial gate structure and fabrication techniques may be employed at operation 660. In some embodiments, operation 660 entails dielectric deposition and planarization, as well as patterning an opening in the dielectric exposing the fin structure, and backfilling the opening with a sacrificial gate. In alternative embodiments, sacrificial gate material is blanket deposited and patterned into gate mandrel stripes.

In the exemplary embodiment illustrated in FIGS. 12A and 12B, a sacrificial gate \1270 is formed over a portion of hetero-fin 103. Sacrificial gate 1270 may be disposed directly on cladding 130, as shown in FIG. 12A. Sacrificial gate 1270 is patterned into a sacrificial mandrel extending over the channel region of hetero-fin 103 and landing on field isolation 115. Other portions of hetero-fin 103 are exposed. In further embodiments represented by FIG. 12A, the channel mask further includes gate sidewall spacer 171 adjacent to sacrificial gate mandrel 1270. Any conventional self-aligned lateral spacer process may be employed at operation 660 to laterally stand-off subsequent processing from sacrificial gate 1270. For example, a dielectric (e.g., silicon dioxide and/or silicon nitride) may be conformally deposited over the hetero-fin and over the channel mask, and an anisotropic etch employed to clear the dielectric except along edges of topography.

Returning to FIG. 6, methods 601 continue at operation 670 where impurity-doped III-V semiconductor material is epitaxially grown on surfaces of the fin cladding not protected by the channel mask or field isolation dielectric. If desired, the source/drain region of the fin cladding may be supplemented and/or thinned prior to epitaxial growth of the impurity-doped source/drain semiconductor. Growth or etch of the fin cladding at this point may differentiate its thickness from that over the channel region. As further illustrated in FIG. 13A, 13B, a doped III-V source/drain region 140 is grown by any epitaxial growth process. For example, any of MOCVD, MBE, HYPE, or the like, may be employed to grow semiconductor material with in-situ impurity doping. In some embodiments, a ternary source/drain material, such as InGaAs or GaAsSb is grown. In some embodiments, one or more alloy constituent that reduces the energy of the conduction band edge, and/or the material bandgap, is linearly graded to higher concentration. For example, In concentration of an InGaAs source/drain alloy is increased during the source/drain overgrowth.

Returning to FIG. 6, methods 601 continue at operation 680 where the channel mask is replaced with a permanent gate stack. Methods 601 are then substantially completed with any suitable contact metallization and backend processing performed at operation 690. For the exemplary embodiment further illustrated in FIGS. 14A and 14B, sacrificial gate 1070 is removed selectively relative to the underlying semiconductor, thereby exposing cladding 130 within the lateral channel region. If desired, the channel region of the fin cladding may be supplemented and/or thinned after removal of the sacrificial gate and prior to deposition of the permanent gate stack. Growth or etch of the fin cladding at this point may differentiate its thickness from that over the source/drain region. A permanent gate stack including a gate dielectric 172 and gate electrode 173 is formed over at least a sidewall of the fin structures, as depicted. While any known gate stack materials may be utilized, in one exemplary embodiment a high-k dielectric material is deposited along with a metal gate electrode having a work function suitable for the III-V composition of fin core 120. As further illustrated in FIGS. 14A and 14B, source/drain contact metallization 150 is formed for example by depositing Ti and/or TiN on narrow bandgap, doped III-V source/drain 140. The structure of high-mobility finFET 101 is then substantially complete as introduced in FIGS. 2 and 3A-3C, and is ready for backend processing following any known techniques.

Figure 15:
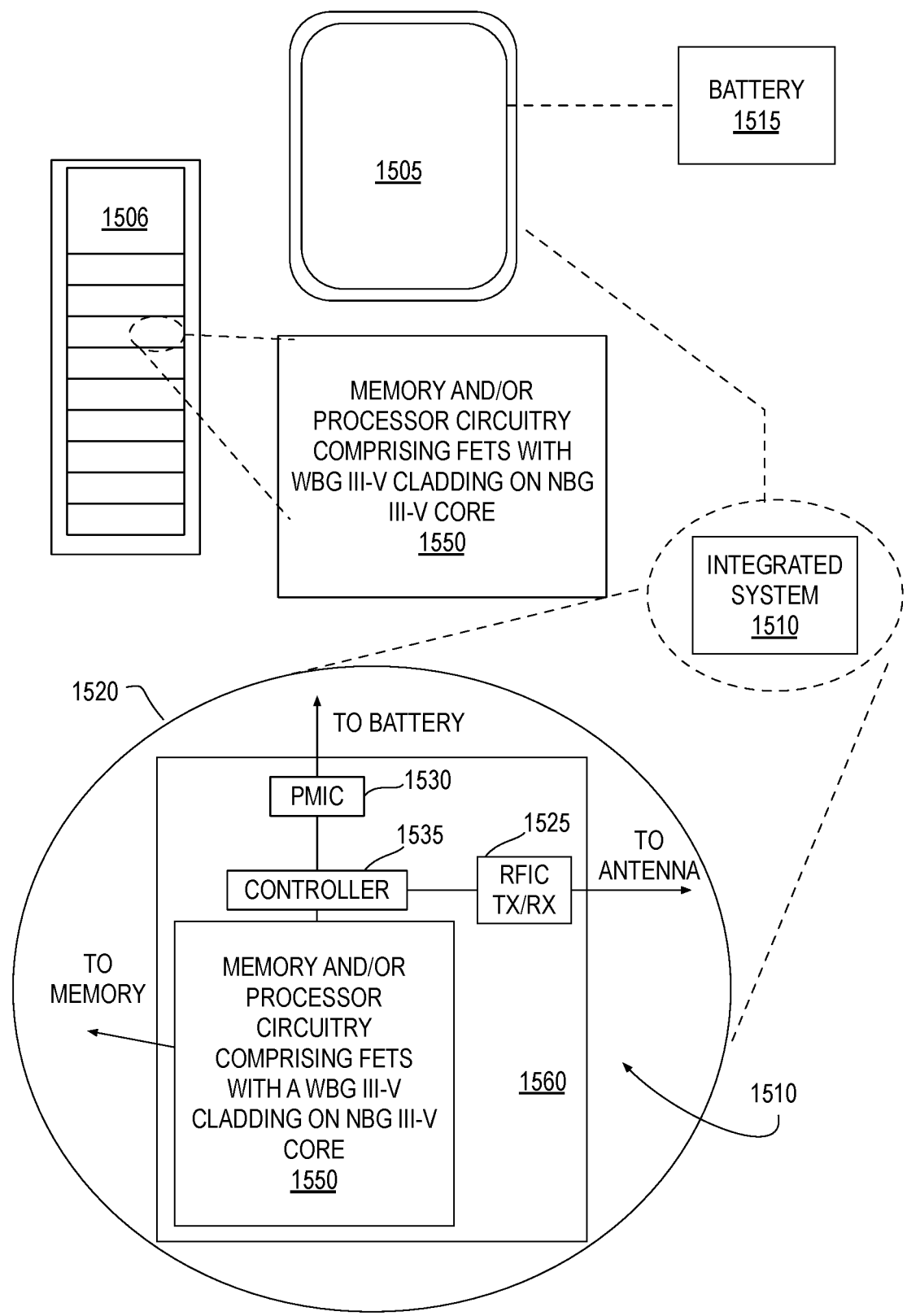
FIG. 15 illustrates a mobile computing platform and a data server machine employing an SoC including a plurality of high-mobility finFETs including a wide bandgap cladding, in accordance with embodiments of the present invention.

FIG. 15 illustrates a mobile computing platform and a data server machine employing an SoC including high-mobility FETs with a wide bandgap semiconductor fin cladding over a narrow bandgap semiconductor fin core for example as describe elsewhere herein. The server machine 1506 may be any commercial server, for example including any number of high-performance computing platforms disposed within a rack and networked together for electronic data processing, which in the exemplary embodiment includes a packaged monolithic SoC 1550. The mobile computing platform 1505 may be any portable device configured for each of electronic data display, electronic data processing, wireless electronic data transmission, or the like. For example, the mobile computing platform 1505 may be any of a tablet, a smart phone, laptop computer, etc., and may include a display screen (e.g., a capacitive, inductive, resistive, or optical touchscreen), a chip-level or package-level integrated system 1510, and a battery 1515.

Whether disposed within the integrated system 1510 illustrated in the expanded view 1520, or as a stand-alone packaged chip within the server machine 1506, packaged monolithic SoC 1550 includes a memory block (e.g., RAM), a processor block (e.g., a microprocessor, a multi-core microprocessor, graphics processor, or the like) including at least one high-mobility n-type finFET with a wide bandgap semiconductor cladding, for example as described elsewhere herein. The monolithic SoC 1550 may be further coupled to a board, a substrate, or an interposer 1560 along with, one or more of a power management integrated circuit (PMIC) 1530, RF (wireless) integrated circuit (RFIC) 1525 including a wideband RF (wireless) transmitter and/or receiver (TX/RX) (e.g., including a digital baseband and an analog front end module further comprises a power amplifier on a transmit path and a low noise amplifier on a receive path), and a controller 1535.

Functionally, PMIC 1530 may perform battery power regulation, DC-to-DC conversion, etc., and so has an input coupled to battery 1515 and with an output providing a current supply to other functional modules. As further illustrated, in the exemplary embodiment, RFIC 1525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 1550.

Figure 16:
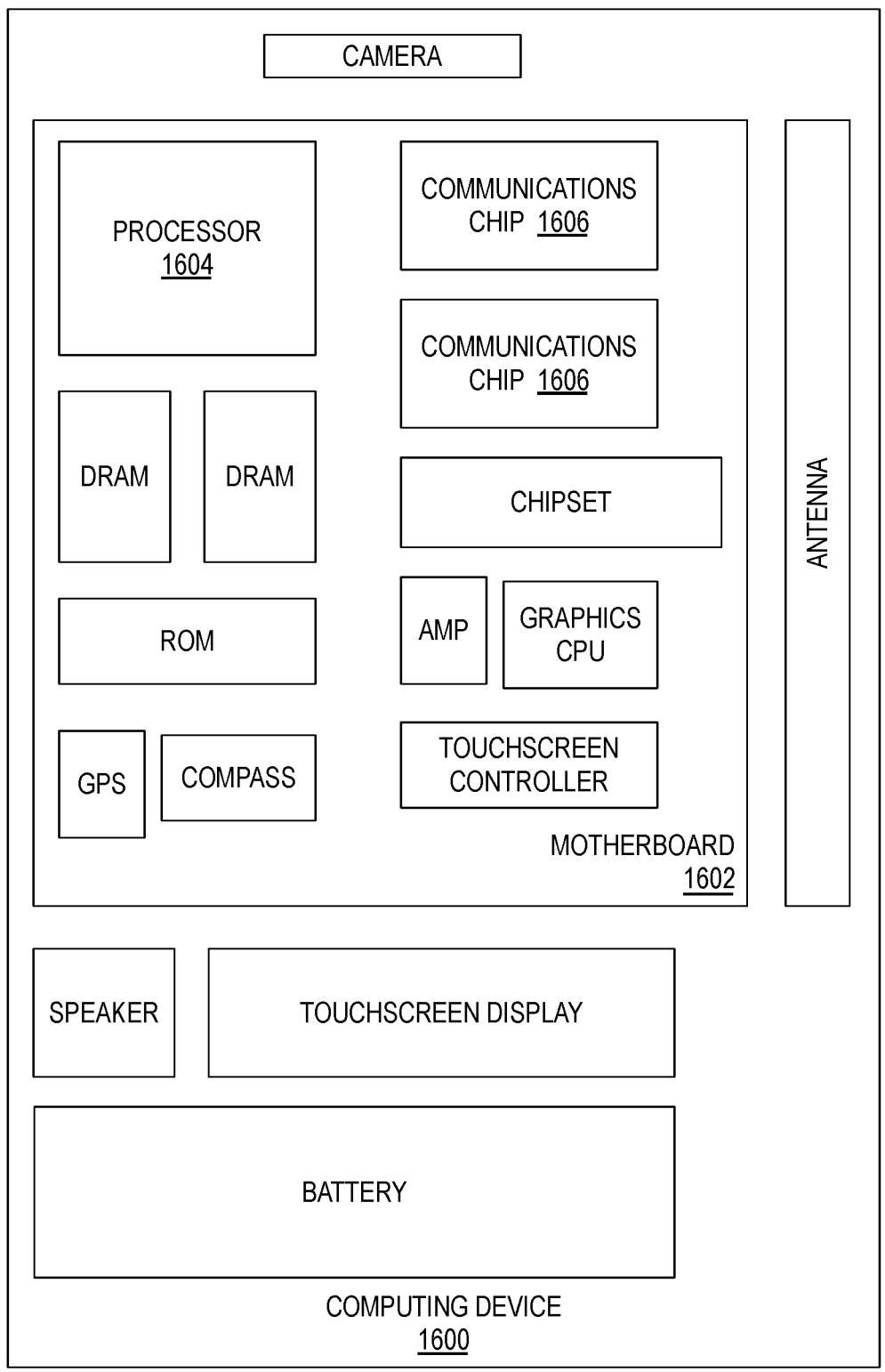
FIG. 16 is a functional block diagram of an electronic computing device, in accordance with an embodiment of the present invention.

FIG. 16 is a functional block diagram of an electronic computing device, in accordance with an embodiment of the present invention. Computing device 1600 may be found inside platform 1505 or server machine 1506, for example. Device 1600 further includes a motherboard 1602 hosting a number of components, such as, but not limited to, a processor 1604 (e.g., an applications processor), which may further incorporate at least one high-mobility finFET with a retrograde source/drain region, for example as describe elsewhere herein. Processor 1604 may be physically and/or electrically coupled to motherboard 1602. In some examples, processor 1604 includes an integrated circuit die packaged within the processor 1604. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a field effect transistor includes a fin comprising core and a cladding on the core. The core comprise a first III-V semiconductor material and the cladding comprises a second III-V semiconductor material having a wider bandgap than the first III-V semiconductor material. The transistor includes a gate stack disposed over the cladding within a channel region of the fin, and source/drain regions disposed over the cladding on opposite sides of the gate stack.

In a second examples, for any one of the first examples the core is an $In_xGa_{1-x}As$ alloy with x being at least 0.6.

In third examples, for any one of the first or second examples the core and the cladding are both $In_xGa_{1-x}As$ alloys. At least one of x for the core is at least 0.6, and x for the cladding is no more than 0.55.

In fourth examples, for any one of the first, second or third examples, x for the cladding is between 0.30 and 0.55, and x for the core is between 0.60 and 0.90.

In fifth examples, for any one of the first, second, third or fourth examples the cladding has a different non-zero thickness within a channel region than within a source/drain region of the fin.

In sixth examples, for any one of the first, second, third, fourth, or fifth examples the fin is disposed on a sub-fin having comprising a third III-V semiconductor having a wider bandgap than the core and the cladding.

In seventh examples, for any one of the sixth examples the sub-fin is disposed on monocrystalline silicon, the channel region and source/drain regions are monocrystalline, the gate stack comprises a high-k gate insulator disposed directly on the cladding, and a metal gate electrode is disposed directly on the high-k gate insulator.

In eighth examples, for any one of the sixth or seventh examples the III-V semiconductor sub-fin is GaAs, the core and the cladding are both $In_xGa_{1-x}As$ alloys, x for the cladding is between 0.30 and 0.55, x for the core is between 0.60 and 0.90, the core has a transverse width of 2-5 nm, and the cladding has a thickness of 1.5-3 nm.

In ninth examples, for any one of the first, second, third, fourth, fifth, sixth, seventh, or eighth examples the transverse width of the sub-fin is equal to that of the core.

In tenth examples, for any one of the first, second, third, fourth, fifth, sixth, seventh, or eighth examples the transverse width of the core is less than that of the sub-fin.

In eleventh examples, for any one of the first, second, third, fourth, fifth, sixth, seventh, eighth, ninth, or tenth examples the semiconductor source/drain regions comprise III-V semiconductor graded from the composition of the cladding to an alloy composition having a bandgap narrower than that of the cladding and the core.

In twelfth examples, a CMOS integrated circuit (IC) comprises a silicon substrate, and an n-type fin field effect transistor (finFET) disposed over a first region of the substrate. The finFET further includes a fin core comprising a ternary III-V semiconductor material having a first alloy composition, a fin cladding comprising a ternary III-V semiconductor material having a second alloy composition with wider bandgap than that of the fin core, a gate stack disposed over the fin cladding within a channel region, and impurity doped n-type semiconductor source/drain regions disposed over the fin cladding on opposite side of the gate stack. In the CMOS IC, a p-type finFET is disposed over a second region of the substrate, the p-type fin FET comprising a silicon fin.

In thirteenth examples, for any one of the twelfth examples the fin core is disposed on a sub-fin comprising a III-V semiconductor having a wider bandgap than the fin core and the fin cladding, the fin core and the fin cladding are both $In_xGa_{1-x}As$ alloys, x for the fin cladding is between 0.30 and 0.55, x for the fin core is between 0.60 and 0.90, the fin core has a transverse width of 2-5 nm, and the fin cladding has a thickness of 1.5-3 nm.

In fourteenth examples, a method of fabricating a III-V fin field effect transistor (FET) comprises forming a fin core disposed on a substrate, the fin core comprising a first III-V semiconductor material having a first alloy composition. The method further comprises epitaxially growing a fin cladding on at least a sidewall of the fin core, the fin cladding comprising a second III-V semiconductor material having a second alloy composition with a wider bandgap than that of the fin core. The method further comprises forming a mask over a channel region of the fin cladding, and epitaxially growing III-V source/drain semiconductor on surfaces of the fin cladding not covered by the mask.

In fifteenth examples, for any one of the fourteenth examples epitaxially growing the fin core further comprises growing a first $In_xGa_{1-x}As$ alloy, where x is at least 0.6, and epitaxially growing the fin cladding further comprises growing a second $In_xGa_{1-x}As$ alloy, where x no more than 0.55.

In sixteenth examples, for any one of the fourteenth or fifteenth examples forming the fin core further comprises forming a trench in a trench layer, the trench exposing a surface of the substrate. Epitaxially growing a sub-fin within the trench, the sub-fin comprising a III-V semiconductor having a third alloy composition associated with a wider bandgap than the second alloy composition, and epitaxially growing the fin core on a surface of the sub-fin.

In seventeenth examples, for any one of the fourteenth, fifteenth or sixteenth examples epitaxially growing the fin core on a surface of the sub-fin further comprises growing the fin core within an upper portion of the trench and the method further comprises recessing the trench layer to expose the fin core sidewall.

In eighteenth examples, for any one of the fourteenth, fifteenth, sixteenth, or seventeenth examples the method further comprises wet etching the fin core prior to growing the cladding.

In nineteenth examples, for any one of the fourteenth, fifteenth, sixteenth, seventeenth or eighteenth examples forming the mask over the channel region further comprises depositing a sacrificial gate stack, patterning the sacrificial gate stack into a mandrel extending over the channel region, and forming a dielectric gate sidewall spacer adjacent to sidewalls of the mandrel. The method further comprises replacing the mandrel with a gate stack that comprises a high-k gate dielectric having a bulk relative permittivity of at least 9 and a metal gate electrode.

In twentieth examples, for any one of the fourteenth, fifteenth, sixteenth, seventeenth, eighteenth, or nineteenth examples the first alloy composition comprises $In_xGa_{1-x}As$, and x is 0.60 to 0.70, the second alloy composition comprises $In_xGa_{1-x}As$, and x is 0.30 to 0.55, the third alloy composition comprises Ga and As, and the cladding is grown to a thickness of 1.5-3 nm.

In twenty-first examples, mobile computer platform comprises a battery, a memory, and a processor coupled to the battery and memory, wherein the processor includes the CMOS IC of any one of the twelfth or thirteenth examples.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. A transistor, comprising:
  a fin comprising a core and a cladding on the core, the core comprising a first III-V semiconductor material, and the cladding comprising a second III-V semicon- ductor material having a wider bandgap than the first III-V semiconductor material;
a gate stack disposed over the cladding within a channel region of the fin; and
source/drain regions disposed over the cladding on opposite sides of the gate stack.

2. The transistor of claim 1, wherein the core is an $In_xGa_{1-x}As$ alloy with x being at least 0.6.

3. The transistor of any one of claim 1, wherein:
the core and cladding are both $In_xGa_{1-x}As$ alloys; and at least one of:
x for the core is at least 0.6;
x for the cladding is no more than 0.55.

4. The transistor of claim 3, wherein:
x for the cladding is between 0.30 and 0.55; and
x for the core is between 0.60 and 0.90.

5. The transistor of claim 1, wherein:
the cladding has a different non-zero thickness within a channel region than within a source/drain region of the fin.

6. The transistor of claim 1, wherein the fin is disposed on a sub-fin comprising a third III-V semiconductor material having a wider bandgap than the core and the cladding.

7. The transistor of claim 6, wherein:
the sub-fin is disposed on monocrystalline silicon;
the semiconductor channel region and source/drain regions are monocrystalline;
the gate stack comprises a high-k gate insulator disposed directly on the cladding; and
a metal gate electrode is disposed directly on the high-k gate insulator.

8. The transistor of claim 7, wherein:
the sub-fin is GaAs;
the core and cladding are both $In_xGa_{1-x}As$ alloys;
x for the cladding is between 0.30 and 0.55;
x for the core is between 0.60 and 0.90;
the core has a transverse width of 2-5 nm; and
the cladding has a thickness of 1.5-3 nm.

9. The transistor of claim 8, wherein the transverse width of the sub-fin is equal to that of the core.

10. The transistor of claim 8, wherein the transverse width of the core is less than that of the sub-fin.

11. The transistor of claim 9, wherein the impurity-doped source/drain regions comprise a III-V semiconductor material graded from the composition of the cladding to an alloy composition having a bandgap narrower than that of the cladding and the core.

12. A CMOS integrated circuit (IC), comprising:
a substrate comprising silicon;
an n-type fin field effect transistor (finFET) disposed over a first region of the substrate, the n-type finFET further including:
a fin core comprising a ternary III-V semiconductor material having a first alloy composition;
a fin cladding comprising a ternary III-V semiconductor material having a second alloy composition with a wider bandgap than that of the fin core;
a gate stack disposed over the fin cladding within a channel region; and
n-type semiconductor source/drain regions disposed over the fin cladding on opposite sides of the gate stack; and a p-type finFET disposed over a second region of the substrate, the p-type fin FET comprising a silicon fin.

13. The CMOS IC of claim 12, wherein:
the fin core is disposed on a sub-fin comprising a III-V semiconductor having a wider bandgap than the fin core and the fin cladding;
the fin core and the fin cladding are both $In_xGa_{1-x}As$ alloys;
x for the fin cladding is between 0.30 and 0.55;
x for the fin core is between 0.60 and 0.90;
the fin core has a transverse width of 2-5 nm; and
the fin cladding has a thickness of 1.5-3 nm.

14. A mobile computer platform, comprising:
a battery;
a memory; and
a processor coupled to the battery and memory, wherein the processor includes the CMOS IC of claim 12.

15. A method of fabricating a III-V fin field effect transistor (FET), the method comprising:
forming a fin core disposed on a substrate, the fin core comprising a first III-V semiconductor material having a first alloy composition;
epitaxially growing a fin cladding on at least a sidewall of the fin core, the fin cladding comprising a second III-V semiconductor material having a second alloy composition with a wider bandgap than that of the fin core;
forming a mask over a channel region of the fin cladding; and
epitaxially growing III-V source/drain semiconductor on surfaces of the fin cladding not covered by the mask.

16. The method of claim 15, wherein:
epitaxially growing the fin core further comprises growing a first $In_xGa_{1-x}As$ alloy, where x is at least 0.6; and
epitaxially growing the fin cladding further comprises growing a second $In_xGa_{1-x}As$ alloy, where x is no more than 0.55.

17. The method of claim 15, wherein forming the fin core further comprises:
forming a trench in a trench layer, the trench exposing a surface of the substrate; epitaxially growing a sub-fin within the trench, the sub-fin comprising a III-V semiconductor having a third alloy composition associated with a wider bandgap than the second alloy composition; and
epitaxially growing the fin core on a surface of the sub-fin III-V semiconductor.

18. The method of claim 17, wherein:
epitaxially growing the fin core on a surface of the sub-fin III-V semiconductor further comprises growing the fin core within an upper portion of the trench; and
the method further comprises recessing the trench layer to expose the fin core sidewall.

19. The method of claim 17, wherein the method further comprises wet etching the fin core prior to growing the cladding.

20. The method of claim 17, wherein:
the first alloy composition comprises $In_xGa_{1-x}As$, and x is 0.60 to 0.7;
the second alloy composition comprises $In_xGa_{1-x}As$, and x is 0.3 to 0.55;
the third alloy composition comprises Ga and As; and
the cladding is grown to a thickness of 1.5-3 nm.

* * * * *